(12) United States Patent
Suhir

(10) Patent No.: US 6,239,382 B1
(45) Date of Patent: May 29, 2001

(54) DEVICE AND METHOD OF CONTROLLING THE BOWING OF A SOLDERED OR ADHESIVELY BONDED ASSEMBLY

(75) Inventor: Ephraim Suhir, Randolph, NJ (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/388,242

(22) Filed: Sep. 1, 1999

(51) Int. Cl.[7] ........................................ H05K 1/00
(52) U.S. Cl. ..................... 174/258; 174/255; 174/256; 174/259; 428/210
(58) Field of Search .................... 174/16.3, 255, 174/259, 256, 258; 428/210

(56) References Cited

U.S. PATENT DOCUMENTS 6,028,772 * 2/2000 Suhir ................................... 361/708

* cited by examiner

*Primary Examiner*—Cathy Lam
(74) *Attorney, Agent, or Firm*—James J. DeCarlo. Esq.; Stroock & Stroock & Lavan LLP

(57) ABSTRACT

A method of controlling i.e., minimizing the bowing of the base of an assembly by controlling the location, thickness, and characteristics of the constituent materials used to construct the base.

15 Claims, 1 Drawing Sheet

DEVICE AND METHOD OF CONTROLLING THE BOWING OF A SOLDERED OR ADHESIVELY BONDED ASSEMBLY

FIELD OF THE INVENTION

The present invention is directed to preventing bowing of a stacked, soldered, adhesively bonded, or otherwise connected assembly, and, more particularly, to a method and device that prevent bowing of the assembly when it is exposed to change in temperature.

BACKGROUND OF THE INVENTION

Optoelectric devices and electronic components having microelectronic, optoelectronic or photonic components or devices (such as, lasers, for example), are often mounted on bases (assemblies) that consist of a plurality of stacked, dissimilar materials. In such devices, a component is typically mounted to a (first) material that is, in turn, secured to a second, dissimilar, material; such dissimilar materials being attached, using solder, an adhesive, or the like. During the attachment (e.g.,) soldering process, the electronic assembly is exposed to an elevated temperature (e.g., high enough to cause the solder to re-flow) and subsequently cooled down to a lower temperature. The different coefficients of thermal expansion (CTE) in dissimilar materials cause the materials to expand (or contract) at different rates in response to changes in temperature. As a result, the base (assembly) can experience appreciable (residual curvature). At the same time, proper operation of a photonic device requires precise optical alignment between and among the devices, lensed fibers, etc. mounted to the first material. For example, a lateral misalignment of only 0.5 $\mu$m between the lightguides (e.g., a laser and a lensed optical fiber) will render the optoelectric device inoperable.

Bowing of the base (assembly) is currently compensated for by aligning the various optical components mounted on the base after the assembly is manufactured. This procedure, referred to as active alignment, is costly and time consuming. Moreover, active alignment only addresses the misalignment before the electronic device is installed or deployed for use; after which deviation in the flatness of the base may not be corrected.

It is thus desirable to provide a method for controlling the bowing of a multi-material assembly that overcomes the above-described shortcomings of the prior art.

SUMMARY OF THE INVENTION

The present invention is directed to a method of controlling (i.e., minimizing) the bowing of an assembly by controlling the location, thickness, and characteristics of the materials of the solder (adhesive) layers used to construct the base.

In a first embodiment, the present invention comprises a method of controlling the bowing of an electronic assembly, where the base (assembly) is comprised of a plurality of stacked, dissimilar materials. The inventive method formulated in application to a soldered bi-material assembly, comprises the steps of providing a first material, having a thickness $h_1$, and providing a second material that is different from the first material and having a thickness $h_2$. The method further comprises the step of providing a third ("adhesive") material that is different from the first and second materials, secures the first and second materials together in stacked relation to each other, and is located between the first and the second materials at a position determined by the equation:

$$T_1 h_1 + T_2 h_2 = 0,$$

where $T_1$ and $T_2$ are thermally induced forces due to thermal expansion (contraction) mismatch caused by the dissimilar materials in the assembly.

In a second embodiment, the method of the present invention comprises the steps of providing a first material, having a thickness $h_2$, and providing a second material that is different from the first material and having a thickness $h_1$. The inventive method also includes the step of providing a third material that is different from the first and second materials and that has a thickness $h_3$ adequate to prevent bowing of the assembly. The third material acts as an adhesive and secures the first and second materials together in stacked relation to each other and is located between the first and the second materials.

In a third embodiment, the method of the present invention comprises the steps of providing a first material having a thickness $h_1$ and providing a second material that is different from the first material and having a thickness $h_2$. The inventive method further comprises the step of providing a third material that is different from the first and second materials and that has a Young's modulus and/or a coefficient of thermal expansion adequate to prevent bowing of the assembly. The third material acts as an adhesive and secures the first and second materials together in stacked relation to each other and is located between the first and second materials.

The three embodiments may be used separately, or in any combination to control the bowing of the base of an assembly.

The present invention is also directed to an assembly comprising a base having a first component and a second component, each mounted to the base and in operable alignment with each other. The base comprises a plurality of stacked, dissimilar materials, including a first material that has a thickness $h_1$, and a second material that is different from the first material and that has a thickness $h_2$, and a third material that is different from the first and second materials, that secures the first and second materials together in stacked relation to each other, and that is located between the first and second materials at a position determined by the equation $$T_1 h_1 + T_2 h_2 = 0,$$

where $T_1$ and $T_2$ are thermally induced forces caused by the thermal expansion (contraction) mismatch caused by the different first and second materials. The location of the third material in the assembly with respect to the first and second materials prevents the bowing of the assembly beyond a predetermined amount so as not to impair operation of the electronic or photonic component or device.

The present invention is further directed to an assembly comprising a base having a first component and a second component, each mounted to the base and in operable alignment with each other. The base comprises a plurality of stacked, dissimilar materials, including a first material that has a thickness $h_1$, and a second material that is different from the first material and that has a thickness $h_2$, and a third material that is different from the first and second materials and that has a thickness $h_3$ that is sufficient to prevent bowing of the base. The third material secures the first and second materials together in stacked relation to each other and is located therebetween.

The present invention is also directed to an assembly comprising a base having a first component and a second component, each mounted to the base and in operable alignment with each other. The base comprises a plurality of stacked, dissimilar materials, including a first material that has a thickness $h_1$, and a second material that is different from the first material and that has a thickness $h_2$, and a third material that is different from the first and second materials and that has a Young's modulus and/or a coefficient of thermal expansion that is sufficient to prevent bowing of the base. The third material secures the first and second materials together in stacked relation to each other and is located therebetween;

Other objects and features of the present invention will become apparent from the following detailed description, considered in conjunction with the accompanying drawing FIGURE. It is to be understood, however, that the drawings, which are not to scale, are designed solely for the purpose of illustration and not as a definition of the limits of the invention, for which reference should be made to the appended claims.

BRIEF DESCRIPTION OF THE DRAWINGS

For a fuller understanding of the invention, reference is had to the following description taken in connection with the accompanying drawing, in which.

DETAILED DESCRIPTION OF THE PRESENTLY PREFERRED EMBODIMENTS

Figure 1:
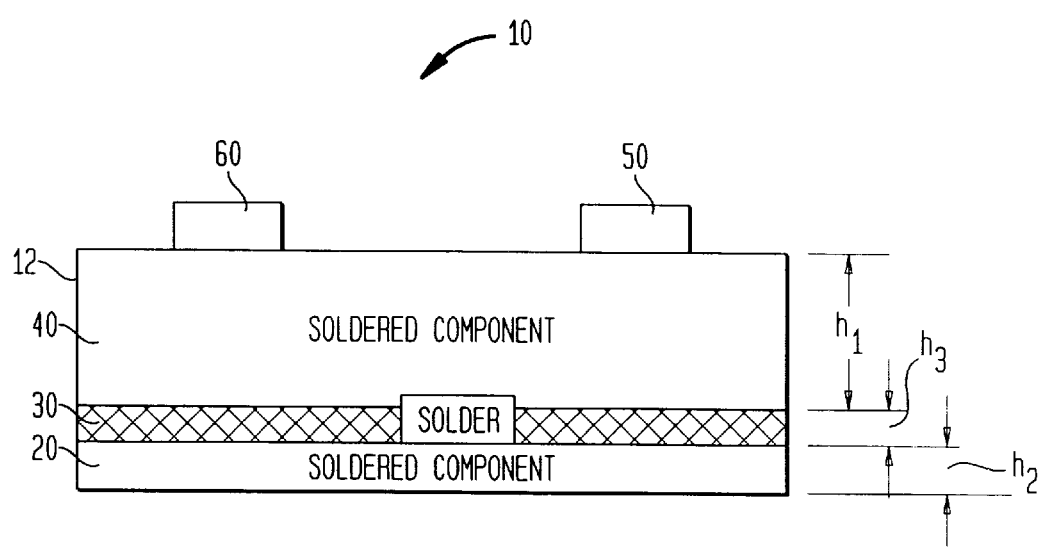
FIG. 1 is a cross-sectional view of an electronic assembly having a base comprised of a plurality of stacked layers of dissimilar material and constructed in accordance with the present invention.

The present invention is directed to a method of controlling (i.e., minimizing) the bowing of an assembly comprised of a plurality of stacked, dissimilar materials. In a first embodiment, the present invention controls the bowing of the base by determining the position of a solder or adhesive layer in the base stack. In a second embodiment, the present invention controls the bowing of the base by setting the thickness of the solder or adhesive layer. In a third embodiment, the present invention controls the bowing by selecting a material for the solder or adhesive layer that has a high Young's modulus and/or a high coefficient of thermal expansion. This is needed to make this layer, although thin, as effective as possible to minimize the bow. The various embodiments of the present invention may individually, or in combination with and among each other, be used to control the bowing of the base of an assembly.

Referring now to the drawing in detail, FIG. 1 is a cross-sectional view of a part of an electronic assembly 10 having a base 12 comprised of a plurality of stacked layers of dissimilar material. The base 12 includes a first layer 40 that may be, for example Beryllium Oxide, or other similar material, and a second layer 20 that may be, for example, Tungsten Copper, or other similar material. Various different materials may be used for the first and second layers 40, 20, provided that the two materials are dissimilar. The first layer 40 and the second layer 20 are secured together by a third layer 30 that may be solder or some other similar material such as, for example, a heat-curable adhesive, that can provide the desired securement of the layers to each other and that can further provide the desired characteristics of the present invention as discussed in more detail below.

In the embodiment depicted in FIG. 1, a laser 50 and a fiber-optic cable 60 are mounted to the first layer 40 and are optically aligned with each other. It will be obvious to persons skilled in the art that the present invention is directed to any electronic and/or electro-mechanic device for which deviation from ideal geometric conditions (e.g., flatness of the base of the assembly) may result in inoperability of the device. Thus, the components mounted to the first layer 40 may be optic, electronic, electro-mechanic, or any other component that requires alignment with another component.

With continued reference to FIG. 1, the functionality of the electronic assembly 10 requires that optical alignment between the laser 50 and cable 60 be maintained. A lateral misalignment of the base 12, which may be caused by bowing of the base 12 during thermal processing (i.e., solder re-flow) or as a result of exposure of the base 12 or electronic assembly 10 to changes in temperature, of no greater than 0.5 μm will render the electronic assembly 10 inoperable due to the misalignment of the laser 50 and cable 60. The present invention ensures the flatness of the base 12 without requiring post-processing alignment, i.e., active alignment, of the electronic devices mounted thereto.

Bowing of the base 12 may be caused, for example, by the different coefficients of thermal expansion (and/or contraction) (CTE) of the dissimilar materials that make up the base 12. This is true because different materials expand and contract in response to changes in temperature at different rates. The present invention controls the bowing of the base 12 so that the operation of the electronic assembly 10 will not be effected. For optical devices and circuits, this means that bowing of the base 12 will not be greater than approximately 0.5 μm. In a preferred embodiment the present invention limits the bowing of the base 12 to approximately 0.1 μm.

In a first embodiment of the present invention, bowing of the electronic assembly 10 is controlled by determining the vertical (in the drawing) position of the third layer 30 in the base 12. By selecting the thickness for the first and second layers 40, 20, designated generally herein as $h_1$ and $h_2$, the vertical position of the third layer 30 may be determined. The thickness of the first and second layers 40, 20 may be determined using the following equation:

$$T_1 h_1 + T_2 h_2 = 0 \qquad (1)$$

The base 12 of the electronic assembly 10 will experience virtually zero bow, and the third layer 30 will not be susceptible to bending, when the sum of the products of the thermally induced force $T_1$ and thickness hi for the first and second layers 40, 20 equals zero, as required by equation (1). In other words, the third layer 30 will prevent bowing of the first and second layers 40, 20 and will not bend when the thermally induced forces and layer thicknesses produce an equilibrium condition in the base 12.

Derivation of equation (1) will now be discussed in detail. For an elongated base 12 having first and second layers 40, 20 secured together by a solder layer 30, the condition of the compatibility of the strains of each layer must satisfy the relationship defined by equation (2):

$$-\alpha_2 \Delta t + \lambda_2 T_2 = -\alpha_1 \Delta t + \lambda_1 T_1 = -\alpha_3 \Delta t + \lambda_3 T_3 \qquad (2)$$

where $\alpha_i$ (i=1, 2, 3) is the coefficient of thermal expansion (or contraction) of the i-th layer (material), $\Delta t$ is the change in temperature to which the base 12 is exposed during soldering, operation, etc. of the electronic assembly 10, etc., and $T_i$ is the thermally induced force experiences by the various layers and caused by the thermal contraction mismatch of those materials. This equation demonstrates that the base 12 is in a state of equilibrium and that changes in temperature will cause the various layers of the base 12 to experience different thermally induced forces (i.e., $T_i$). This equation further demonstrates that the sum of the forces within the base 12 must equal zero.

The longitudinal compliance ($\lambda_i$) of the i-th layer are determined by the equation:

$$\lambda_i = \frac{1}{E_i^* h_i}, \, i = 1, 2, 3 \qquad (3)$$

where $E^*_i$ is the generalized Young's modulus of the i-th material and is determined by the formula:

$$E_i^* = \frac{E_i}{1 - v_i^2}, \, i = 1, 2, 3 \qquad (4)$$

in which $E_i$ is the Young's modulus of the i-th material, $v_i$ is Poisson's ratio, $h_i$ is the thickness of the i-th layer, and $T_i$ is the thermally induced force caused by the thermal contraction mismatch of the layer materials. The first terms in equation (2) (e.g., $\alpha_1 \Delta t$) are stress free contraction strains, and the second terms (e.g., $\lambda_i T_i$) account for the strains due to the forces $T_i$. These forces must satisfy the equilibrium condition:

$$T_1 + T_2 + T_3 = 0. \qquad (5)$$

Combining equations (2) and (5), a system of algebraic equations for the unknown forces $T_i$ may be obtained:

$$\left. \begin{array}{l} \lambda_2 T_2 - \lambda_1 T_1 = (\alpha_2 - \alpha_1)\Delta t \\ \lambda_2 T_2 - \lambda_3 T_3 = (\alpha_2 - \alpha_3)\Delta t \\ T_1 + T_2 + T_3 = 0 \end{array} \right\} \qquad (6)$$

The system of equations (6) has the following solution:

$$\left. \begin{array}{l} T_2 = \frac{\Delta t}{D}[\alpha_2(\lambda_1 + \lambda_3) - \alpha_1 \lambda_3 - \alpha_3 \lambda_1] \\ T_1 = \frac{\Delta t}{D}[\alpha_1(\lambda_2 + \lambda_3) - \alpha_2 \lambda_3 - \alpha_3 \lambda_2] \\ T_3 = \frac{\Delta t}{D}[\alpha_3(\lambda_2 + \lambda_1) - \alpha_2 \lambda_1 - \alpha_1 \lambda_2] \end{array} \right\} \qquad (7)$$

where the determinant of the system of equations (6) is:

$$D = \lambda_2 \lambda_1 + \lambda_1 \lambda_3 + \lambda_2 \lambda_3 \qquad (8)$$

Introducing the expressions for the forces $T_2$ and $T_1$ from equation (7) into equation (1) yields the following quadratic equation that defines the thickness ratio $$\left( \eta = \frac{h_2}{h_1} \right)$$

for the first and second layers 40, 20:

$$\eta^2 - \delta\eta - \gamma = 0, \qquad (9)$$

where:

$$\delta = \frac{\alpha_2 \alpha_1}{\alpha_3 - \alpha_2} \frac{E_1^*}{E_3^*} \frac{h}{h_3} \qquad (10)$$

-continued $$\gamma = \frac{\alpha_3 - \alpha_1 E_1^*}{\alpha_3 - \alpha_2 E_2^*} \qquad (11)$$

and where $h = h_2 + h_1$. The equation (9) has the following solution:

$$\eta = \frac{\delta}{2}\left(1 \pm \sqrt{1 + \left(\frac{2}{\delta}\right)^2 \gamma}\right). \qquad (12)$$

For the condition where $\delta > 0 (\alpha_2 > \alpha_1)$, equation (12) should be considered positive, and for the condition where $\delta < 0 (\alpha_2 < \alpha_1)$, equation (12) should be considered negative so that the value of $\eta$ will always be positive. Typically, the CTE of solder (i.e., the third layer 30), $\alpha_3$, is larger than the CTE's of the materials of the first and second layers 40, 20. Consequently, $\gamma > 0$.

With the equations provided above, the present invention provides a plurality of methods of controlling the bowing of the base 12 of an electronic assembly 10. In a first embodiment, the vertical position of the third layer 30 in the base 12 is determined by selecting the thicknesses of the first and second layers 40, 20 so that equation (1) is satisfied. The base 12 of an electronic assembly 10 constructed so as to satisfy equation (1) will exhibit virtually no bowing when the assembly 10 is exposed to changes in temperature.

In a third embodiment, a material is selected for the third layer 30 having a high Young's modulus $E^*_3$ and/or a high coefficient of thermal expansion $\alpha_3$. Preferably, the material will have a Young's modulus of at least 10,000 kg/mm² and/or a coefficient of thermal expansion of at least $25 \times 10^{-6}/°$ C.

The following are provided as illustrative, non-limiting examples of the present invention. As an example of the first embodiment, in which the position of the third layer 30 is controlled by the thicknesses of the first and second layers 40, 20, let:

$\alpha_2 = 6.9 \times 10^{-6}/°$ C.;
$\alpha_1 = 7.7 \times 10^{-6}/°$ C.;
$\alpha_3 = 15.0 \times 10^{-6}/°$ C.;
$E^*_2 = 38,600$ kg/mm²;
$E^*_3 = 4,870$ kg/mm²;
$E^*_1 = 28,600$ kg/mm²;
$h = 2.0$ mm; and
$h_3 = 0.0508$ mm Then, equations (10) and (11) yield:

$$\delta = \frac{0.8}{8.1} \times 5.8727 \times 39.3701 = -22.8354,$$

$$\gamma = \frac{7.3}{8.1} \times 0.7409 = 0.6678,$$

so that, solving equation (12), $\eta = 0.292$, $h_2 = 0.0568$ mm and $h_1 = 1.9432$ mm. In theory, an extremely thin second layer 20 will produce virtually zero bow of the base 12.

As another illustrative example of the present invention, the thickness of the third layer 30 may be calculated to further control the bowing of the base 12. In this example, the solder layer has a thickness $h_3$ of approximately 0.2052 mm (8 mils). Equation (12) then yields $\delta = -5.7089$, $\eta = 0.1147$, $h_2 = 0.2057$ mm, and $h_1 = 1.7943$ mm. If the thickness of the solder layer $h_3$ is increased to approximately 0.3048 mm (12 mils), then equation (12) yields $\delta = -3.8059$, $\eta=0.1680$, $h_2=0.2877$ mm, and $h_1=1.7123$ mm. In effect, the present invention substitutes a bi-material base (in which the solder layer is typically not considered), with a tri-material base, in which the solder layer plays an important part in controlling the bow of the base 12.

As yet another example of the present invention, a solder or adhesive material with a CTE $\alpha_3$ equal to at least approximately $25 \times 10^{-6}/°$ C. and a Young's modulus $E^*_3$ of at least approximately 10,000 kg/mm², equations (10) and (11) yields:

$$\delta = -\frac{0.8}{18.1} 2.86 \times 39.3701 = -4.9767$$

$$\gamma = \frac{7.4}{18.1} 2.86 = 1.1693.$$

Solving equation (12) provides $\eta=0.2248$, $h_2=0.3671$ mm, $h_1=1.6329$ mm. These thicknesses are even more favorable from the manufacturability point of view.

While the present invention has been disclosed as being applicable to assemblies used for photonics devices (e.g., lasers) and systems, the present invention is applicable to virtually any assembly or structure comprised of a plurality of stacked, dissimilar materials.

Thus, while there have been shown and described and pointed out fundamental novel features of the invention as applied to preferred embodiments thereof, it will be understood that various omissions and substitutions and changes in the form and details of the disclosed invention may be made by those skilled in the art without departing from the spirit of the invention. It is the intention, therefore, to be limited only as indicated by the scope of the claims appended hereto.

What is claimed is:

1. An electronic assembly comprising:
   a base having a plurality of stacked, dissimilar materials, said base comprising:
      a first material having a thickness $h_1$;
      a second material that is different from said first material and having a thickness $h_2$; and
      a third material that is different from said first and said second materials and that secures said first and said second materials together in stacked relation to each other and that is located between said first and said second materials at a position determined by the equation $$T_1 h_1 + T_2 h_2 = 0,$$

where $T_1$ and $T_2$ are thermally induced forces of thermal contraction caused by the different first and second materials, the location of said third material in said base with respect to said first and said second materials controlling the bowing of said base when said base is exposed to changes in temperature;
      a first electronic component mounted to said first material; and
      a second component mounted to said first material and in operable alignment with said first electronic component such that bowing of said base beyond a predetermined amount will impair operation of said electronic assembly.

2. An electronic assembly as recited by claim 1, wherein said first component is a laser and wherein bowing of said base beyond approximately 0.5 μm will impair operation of said electronic assembly.

3. An electronic assembly as recited by claim 1, wherein said third material is solder.

4. An electronic assembly as recited by claim 1, wherein said third material is a heat-curable adhesive.

5. An electronic assembly as recited by claim 3, wherein said first material is Beryllium Oxide and wherein said second material is Tungsten Copper.

6. An electronic assembly comprising:
   a base having a plurality of stacked, dissimilar materials, said base comprising:
      a first material having a thickness $h_1$;
      a second material that is different from said first material and having a thickness $h_2$; and
      a third material that is different from said first and said second materials and having a thickness $h_3$ that is sufficient to prevent bowing of said base when said base is exposed to changes in temperature, said third material securing said first and said second materials together in stacked relation to each other and being located therebetween;
   a first electronic component mounted to said first material; and
   a second component mounted to said first material and in operable alignment with said first electronic component such that bowing of said base beyond a predetermined amount will impair operation of said electronic assembly.

7. An electronic assembly as recited by claim 6, wherein said first component is a laser and wherein bowing of said base beyond approximately 0.5 μm will impair operation of said electronic assembly.

8. An electronic assembly as recited by claim 7, wherein said third material is solder.

9. An electronic assembly as recited by claim 7, wherein said third material is a heat-curable adhesive.

10. An electronic assembly as recited by claim 8, wherein said first material is Beryllium Oxide and wherein said second material is Tungsten Copper.

11. An electronic assembly comprising:
    a base having a plurality of stacked, dissimilar materials, said base comprising:
       a first material having a thickness $h_1$;
       a second material that is different from said first material and having a thickness $h_2$; and
       a third material that is different from said first and said second materials and having a Young's modulus and/or a coefficient of thermal expansion that is sufficient to prevent bowing of said base when said based is exposed to changes in temperature, said third material securing said first and said second materials together in stacked relation to each other and being located therebetween;
    a first electronic component mounted to said first material; and
    a second component mounted to said first material and in operable alignment with said first electronic component such that bowing of said base beyond a predetermined amount will impair operation of said electronic assembly.

12. An electronic assembly as recited by claim 11, wherein said first electronic component is a laser and wherein bowing of said base beyond approximately 0.5 μm will impair operation of said electronic assembly.

13. An electronic assembly as recited by claim 11, wherein said third material is solder.

14. An electronic assembly as recited by claim 11, wherein said third material is a heat-curable adhesive.

15. An electronic assembly as recited by claim 13, wherein said first material is Beryllium Oxide and wherein said second material is Tungsten Copper.

* * * * *